United States Patent [19]

Nelson

[11] 4,185,292

[45] Jan. 22, 1980

[54] POTENTIAL TROUGHS FOR CHARGE TRANSFER DEVICES

[75] Inventor: Richard D. Nelson, Santa Ana, Calif.

[73] Assignee: The United States of America as represented by the Secretary of the Air Force, Washington, D.C.

[21] Appl. No.: 930,788

[22] Filed: Aug. 3, 1978

Related U.S. Application Data

[63] Continuation of Ser. No. 840,334, Oct. 7, 1977, abandoned.

[51] Int. Cl.² .............................................. H01L 27/78
[52] U.S. Cl. ........................................ 357/24; 357/91
[58] Field of Search .................................... 357/24, 91

[56] References Cited

U.S. PATENT DOCUMENTS

| 3,826,926 | 7/1974 | White et al. | 357/24 |
| 4,012,587 | 3/1977 | Ochi et al. | 357/24 |

*Primary Examiner*—Edward J. Wojciechowicz
*Attorney, Agent, or Firm*—Joseph E. Rusz; Robert Kern Duncan

[57] ABSTRACT

In a surface channel charge transfer device noise due to the presence of surface states is minimized by ion implanting the charge coupled device propagation channel so as to provide a narrow potential trough which confines the charge to the center of the CCD channel.

1 Claim, 1 Drawing Figure

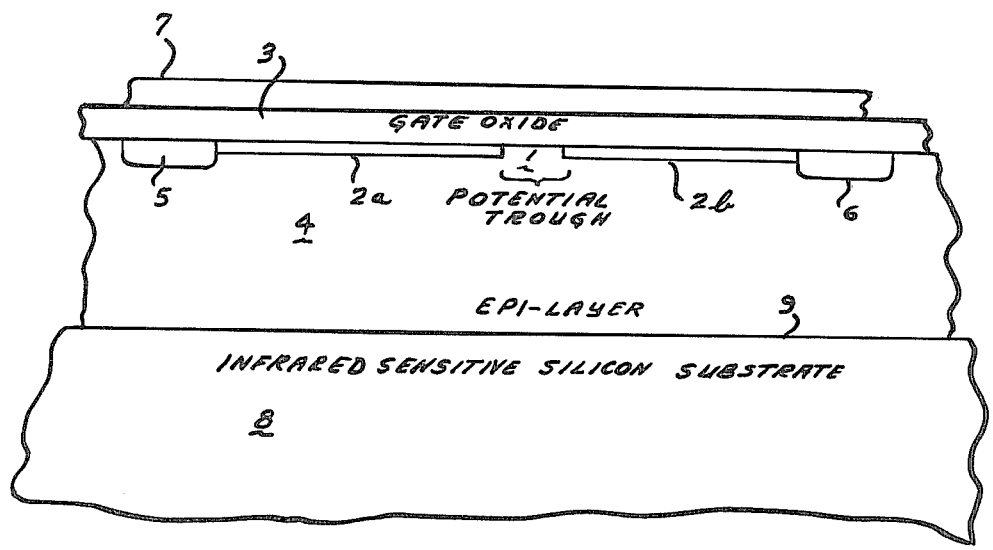

POTENTIAL TROUGHS FOR CHARGE TRANSFER DEVICES

RIGHTS OF THE GOVERNMENT

The invention described herein may be manufactured and used by or for the Government of the United States for all governmental purposes without the payment of any royalty.

This is a continuation of application Ser. No. 840,334, filed Oct. 7, 1977, now abandoned.

BACKGROUND OF THE INVENTION

The field of the invention is in solid state electronic devices and more particularly in the art of charge transfer devices.

It is generally recognized that charge transfer device characteristics are degraded by trapping centers. At low signal levels trapping centers in a charge transfer device (CTD) increase the noise level, decrease dynamic range, and decrease the transfer efficiency of the device.

The following patents may be of interest in developing the background of prior art: U.S. Pat. Nos. 3,792,322 to patentees Boyle et al, 3,936,861 to patentees Borel et al, 3,986,197 to patentee Ablassmeier, and 3,986,198 to patentee Kosonocky.

SUMMARY OF THE INVENTION

An improved charge transfer device is provided in which the charges are transferred down the center of a propagation channel in a very narrow potential trough wherein only the traps in the trough area can affect the propagating charge and, hence, performance is not degraded by the remaining traps in the propagation channel. This results in a lower noise level, increased dynamic range, and increased transfer efficiency, particularly at low signal levels where the propagating charge sees less device area and, hence, fewer surface states.

BRIEF DESCRIPTION OF THE DRAWING

The FIGURE of the drawing illustrates schematically a partial section of a typical charge coupled device having a narrow potential trough.

DESCRIPTION OF THE PREFERRED EMBODIMENT

The drawing illustrates schematically a partial section of a typical charge transfer device having a narrow potential trough 1 formed by the implantation of phosphorus 2a and 2b through the gate oxide 3 into the surface of the propagation channel 4 formed in the conventional LSI (large scale integration) material (typically silicon) by the left and right phosphorus diffusion channel stops 5 and 6. The conventional implanting of phosphorus through the gate oxide layer to form the potential trough is done before the CCD propagation gate layer 7 (typically polysilicon or aluminum) is placed on the gate oxide layer 3.

This particular embodiment of the invention being described in detail is primarily for infrared detection, hence, it is fabricated on a conventional infrared sensitive silicon substrate 8 with the epi-layer 9 for IR isolation. Embodiments fabricated for use in the visual spectrum do not generally require the epi-layer, and utilize a conventional silicon substrate. It is to be understood that conventional electrical contacts are made to the device. The basic CCD structure is well known. The novelty of the invention resides in forming a narrow potential trough in the propagation channel of a conventional CCD which will restrict the charge transferring to a very narrow region. While not required, it is generally desirable to position the trough at the center of the channel. This narrow propagation region, or trough, greatly improves the utility of the device, as previously stated. In addition to the invention being applicable to both infrared and visual detection devices, it is suitable for signal processing devices (such as analog delay lines) of the surface channel type. Surface channel structures are generally preferred to buried channel structures where better linearity of operation is required. For signal processing devices such as delay line the epi-layer is not needed nor does the substrate need to have light sensitive characteristics. Other well known substrate materials, such as lead-tin-telluride, may be used. Likewise, other well known materials in the CCD art may be used for the transfer channel material.

In all surface channel devices there is noise due to the presence of surface states. This invention minimizes this noise by confining charge to the center of the CCD channel by implanting the CCD channel. (Also, it is to be noted that at low signal levels the propagating charge sees less device area and, hence, fewer surface states.)

The shape of the resulting potential well as delineated by the surface potential depth, $\Delta V$ in volts, in the potential trough as a function of the distance (x) measured from the center of the trough, is given by $$\Delta V(x) = \frac{Q}{C_{ox}} \cdot \frac{1}{4\pi} \left\{ \frac{w-x}{h} \ln\left(1 + \left[\frac{2h}{w-x}\right]^2\right) + \frac{w+x}{h} \ln\left(1 + \left[\frac{2h}{w+x}\right]^2\right) + 4\left[\tan^{-1}\left(\frac{w-x}{2h}\right) + \tan^{-1}\left(\frac{w+x}{2h}\right)\right] \right\} = \frac{Q}{C_{ox}} \cdot f(x)$$

where:
$Q$ = implant charge density (coulomb/cm$^2$)
$C_{ox}$ = oxide capacitance (farad/cm$^2$)
$w$ = half width of storage area
$h$ = scaled oxide thickness ($X_{ox}\epsilon_s/\epsilon_{ox}$)
$X_{ox}$ = oxide thickness
$\epsilon_s$ = semiconductor dielectric constant
$\epsilon_{ox}$ = oxide dielectric constant As a numerical example, the shape function, $f(x)$, of the potential well was calculated for $X_{ox} = 2000$ Å and $w = 10$ μm, for distances, x, (in μm) from the center of the trough

| x | f(x) |
|---|---|
| 0 | .96 |
| 2 | .96 |
| 6 | .94 |
| 10 | - edge of trough -  .49 |
| 12 | .08 |
| 15 | .03 |
| 20 | .013 |
| 30 | .055 |

It is apparent in this embodiment that any mobile charge will be substantially confined to the area of the structurally created potential well, i.e, within the trough. If the trough is made too narrow a charge confining potential well will not be formed. The above expression for the potential profile shows the following at the trough edge and center as a function of trough width.

| w/h | f(x = w) | f(x = o) |
|---|---|---|
| ∞ | .5 | 1.0 |
| 100 | .5 | 1.0 |
| 10 | .48 | .94 |
| 1 | .36 | .55 |
| .1 | .11 | .13 |
| 0 | 0 | 0 | where:
w/h = the aspect ratio of the potential profile.
f(x=w) = normalized potential depth at the edge of the trough.
f(x=o) = normalized potential depth at the center of the trough.

From this it is seen that a potential well will generally be formed if the trough width exceeds the oxide thickness by approximately three times (in the particular embodiment being described, w > 0.6 micrometer), and that the charge will be confined to the area of the structurally created potential well, i.e., the trough.

The time constant, $\tau$, for charge to diffuse into the trough is given by $$\tau = 4L^2/\pi^2 D$$

where L = gate width and D = diffusion constant. Assuming a surface field effect mobility of 1000 (cm²/V sec.) the time constant at 20 Kelvin is typically 3 microseconds.

Generally, the trough width is made as narrow as the present state of the photolithography art will conveniently allow. The trough depth (in volts) or the implant density (in impurities per square cm), is determined by requiring that all charge remain in the trough until the noise is limited by GR (Generation Recombination) noise and not surface state noise. The surface state noise, $\delta N$, in electrons is given by $$\delta N = [N_{SS}(KT/q)A_c N]^{\frac{1}{2}}$$

where:
$N_{SS}$ = density of surface states (cm$^{-2}$ev$^{-1}$)
K = Boltzmann's constant
$A_c$ = cell area
N = number of cells through which charge will pass Typically for this embodiment, $$N = [10^{16}(1.73 \times 10^{-3})16(6.45 \times 10^{-6})64]^{\frac{1}{2}} = 338 \text{ electrons.}$$

The GR noise is roughly the square root of two times the bucket charge. Equating these quantities $$N_{GR} = \frac{1}{2}(338)^2$$

$$N_{GR} = 6.4 \times 10^4 \text{ electrons.}$$

This is the minimum number of charges the trough must hold in one storage cell. The trough depth is then $$\Delta V = \frac{qN_{GR}}{C_{ox}L_g(2W)}$$

$$= \frac{(1.6 \times 10^{-19})(6.4 \times 10^4)}{(2 \times 10^{-8})(6 \times 10^{-4})(5 \times 10^{-4})} = 1.7 \text{ volts}$$

where
q = electronic charge
Lg = gate length
w = half cell width

The implant density, $N_i$, in impurities per square cm is given by $$N_i = \frac{(\Delta V)C_{ox}}{q} = \frac{(1.7 \times 10^{-1})(2 \times 10^{-8})}{1.6 \times 10^{-19}} = 2 \times 10^{10} \text{ cm}^{-2}$$

This represents a light implant, it is the implant required for approximately a minimum suitable potential well depth. For embodiments such as being described, it is generally desirable to overimplant and have a potential well deeper than the required minimum. It has been found very suitable to use an implant density of approximately $1 \times 10^{11}$ impurities per square centimeter.

I claim:
1. The improvement in a surface charge transfer device having a propagation channel positioned between a conventional phosphorus diffusion left channel stop element and a conventional phosphorus diffusion right channel stop element, the said propagation channel having a surface and a gate oxide layer positioned over the surface of the said propagation channel, the improvement comprising:
   a. a first phosphorus ion implant having a density of approximately $1 \times 10^{11}$ impurities per square centimeter in the said surface of the propagation channel extending from the said left channel stop element; and
   b. a second phosphorus ion implant having a density of approximately $1 \times 10^{11}$ impurities per square centimeter in the said surface of the propagation channel extending from the said right channel stop element to provide a trough at approximately the center of the said propagation channel between the said first phosphorus implant and the said second phosphorus implant having a width of approximately three times the thickness of the said oxide layer for confining the said surface charge.

* * * * *